United States Patent
O'Neill et al.

(10) Patent No.: US 9,024,316 B2
(45) Date of Patent: May 5, 2015

(54) ELECTRONIC DEVICE COMPRISING STATIC INDUCTION TRANSISTOR AND THIN FILM TRANSISTOR, METHOD OF MANUFACTURING AN ELECTRONIC DEVICE AND DISPLAY PANEL

(75) Inventors: Kevin Michael O'Neill, Eindhoven (NL); Petrus Johannes Gerardus van Lieshout, Beek en Donk (NL)

(73) Assignee: Creator Technology B.V., Breda (NL)

( * ) Notice: Subject to any disclaimer, the term of this patent is extended or adjusted under 35 U.S.C. 154(b) by 459 days.

(21) Appl. No.: 13/003,167

(22) PCT Filed: Jul. 8, 2009

(86) PCT No.: PCT/NL2009/000144
§ 371 (c)(1),
(2), (4) Date: Apr. 6, 2011

(87) PCT Pub. No.: WO2010/005288
PCT Pub. Date: Jan. 14, 2010

(65) Prior Publication Data
US 2011/0180799 A1    Jul. 28, 2011

Related U.S. Application Data

(60) Provisional application No. 61/079,347, filed on Jul. 9, 2008.

(51) Int. Cl.
*H01L 33/08*    (2010.01)
*H01L 21/28*    (2006.01)
(Continued)

(52) U.S. Cl.
CPC ......... *H01L 29/7722* (2013.01); *H01L 27/1251* (2013.01);
(Continued)

(58) Field of Classification Search
CPC .................. H01L 29/7722; H01L 27/3274
USPC ............ 257/40, 41, 473, 57, 59, 66, 72, 102, 257/103
See application file for complete search history.

(56) References Cited

U.S. PATENT DOCUMENTS 6,815,710 B2 * 11/2004 Tsuchida ......................... 257/40
7,420,204 B2 *  9/2008 Iechi et al. ...................... 257/40
(Continued)

FOREIGN PATENT DOCUMENTS

EP    1 246 244 A    10/2002
EP    1246244 A2 *  10/2002
(Continued)

OTHER PUBLICATIONS

Watanabe et al., "Flexible organic static induction transistors using pentacene thin films," Applied Physics Letters, American Institute of Physics, vol. 87, No. 22, Nov. 23, 2005, p. 223505-1 to 223505-3.
(Continued)

*Primary Examiner* — Matthew W Such
*Assistant Examiner* — David Spalla

(57) ABSTRACT

An electronic device comprises at least one static induction transistor (14; 114; 214) and at least one thin film transistor (16; 116). The static induction transistor (14; 114; 214) has a first channel (14.4; 114.4; 214.4) of a semi conducting material extending between a first main electrode (14.2; 114.2; 214.2) and a second main electrode (14.3; 114.3) through a first and a second insulating layer (11, 13; 111, 113), and has a first control electrode (14.1; 114.1) surrounding the first channel and extending between the first and the second insulating layer. The thin film transistor (16; 116) has a third main electrode (16.2; 116.2) and a fourth main electrode (16.3; 116.3) coupled by a second channel (16.4; 116.4) of a semi conducting material and a second control electrode (16.1; 116.1). At least one of the first and the second insulating layer functions as a dielectric layer between the second control electrode and the second channel.

13 Claims, 4 Drawing Sheets

(51) Int. Cl.
  *H01L 29/786* (2006.01)
  *H01L 33/16* (2010.01)
  *H01L 29/772* (2006.01)
  *H01L 29/10* (2006.01)
  *H01L 27/12* (2006.01)
  *H01L 27/32* (2006.01)
  *H01L 51/05* (2006.01)

(52) U.S. Cl.
  CPC ......... *H01L 27/3274* (2013.01); *H01L 29/1029* (2013.01); *H01L 29/7869* (2013.01); *H01L 51/0512* (2013.01)

(56) References Cited

U.S. PATENT DOCUMENTS

2004/0004215 A1* 1/2004 Iechi et al. .................. 257/40
2006/0086933 A1* 4/2006 Iechi et al. .................. 257/40
2007/0290196 A1* 12/2007 Fischer et al. .............. 257/40
2008/0129185 A1* 6/2008 Eden et al. ................. 313/485
2009/0072734 A1* 3/2009 Harada et al. .............. 313/512

FOREIGN PATENT DOCUMENTS

| EP | 1 868 246 A | 12/2007 |
| EP | 1 699 269 A | 9/2009 |
| JP | 59 147467 A | 8/1984 |
| JP | 2006 098542 A | 4/2006 |

OTHER PUBLICATIONS

International Search Report for PCT/NL2009/000144 dated Aug. 19, 2009.

* cited by examiner

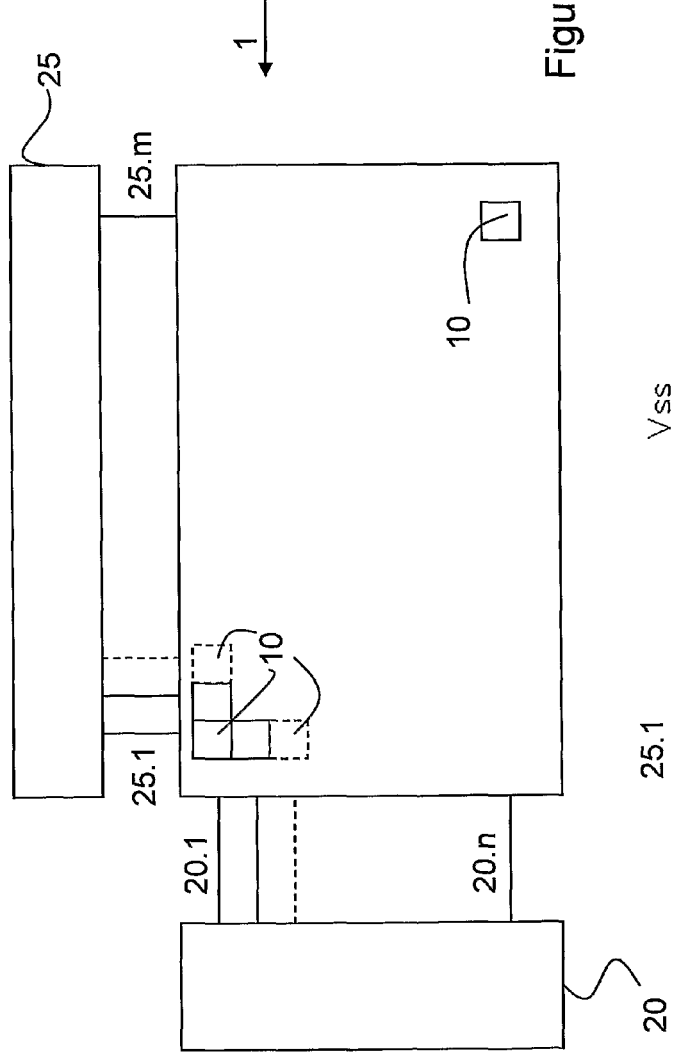
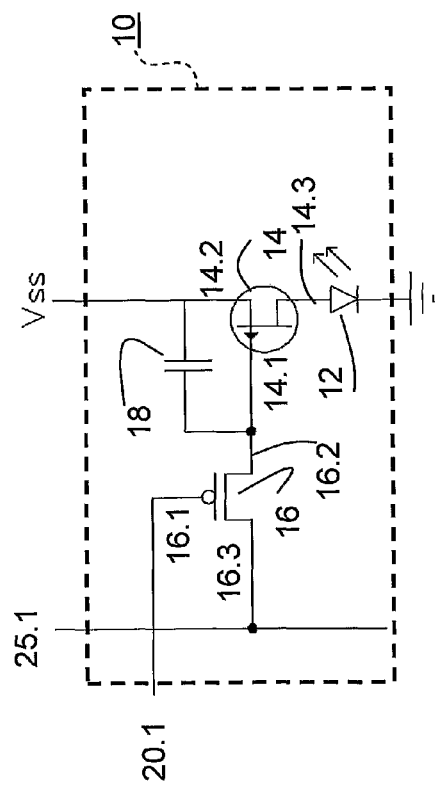
Figure 1
Figure 2

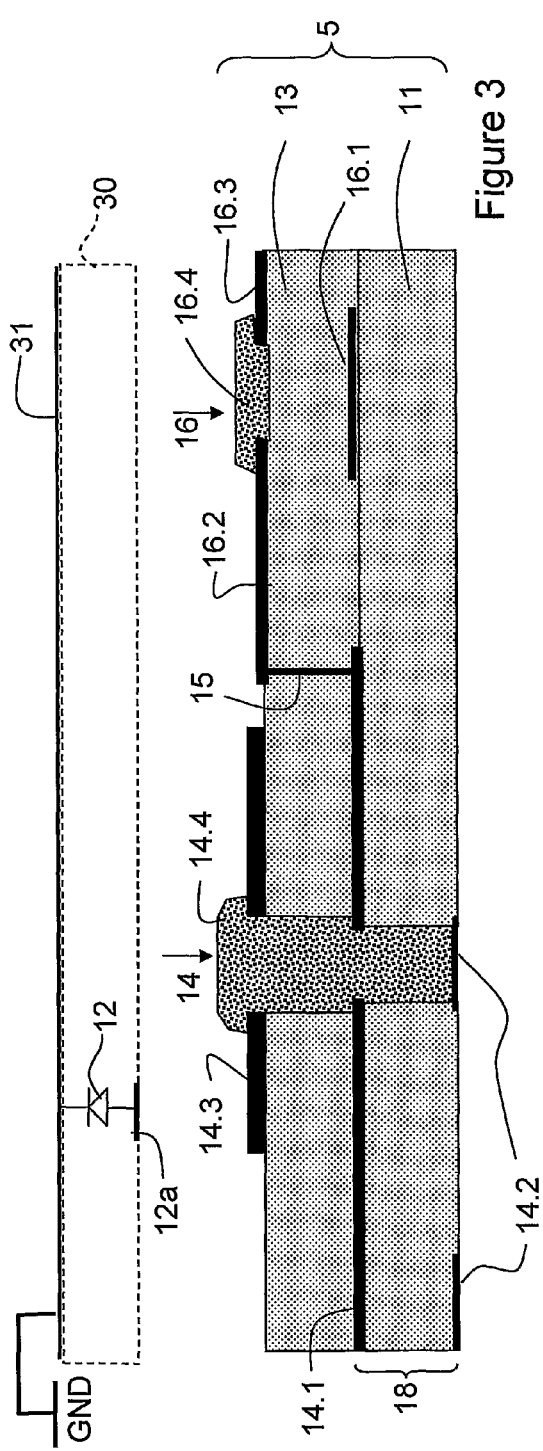
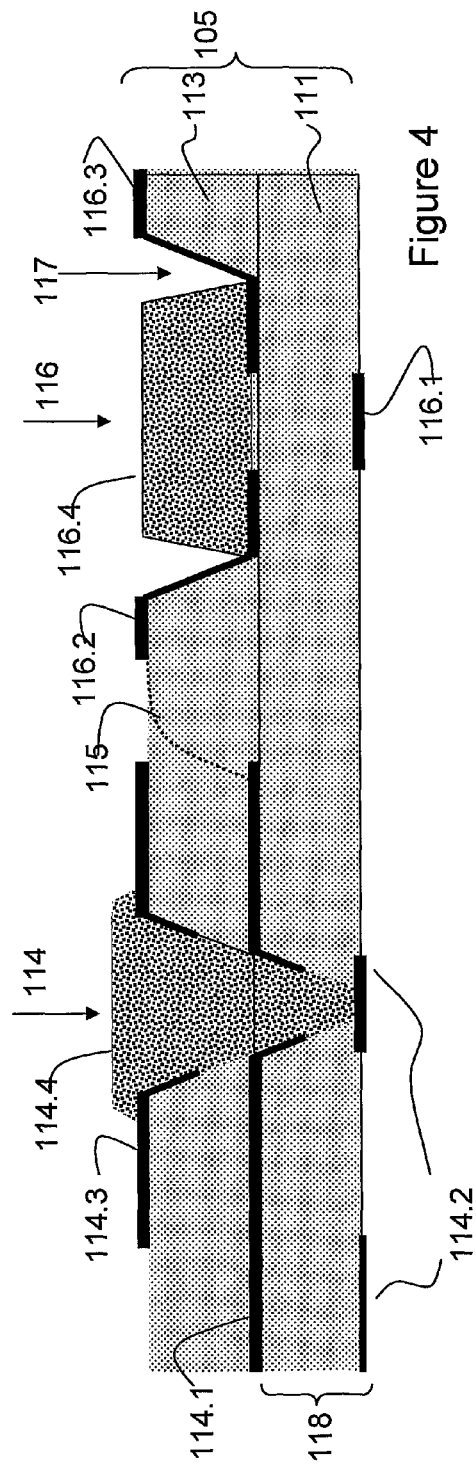

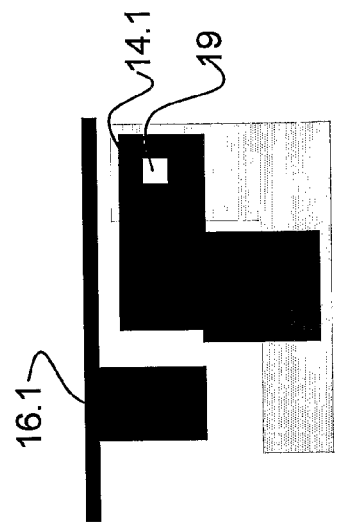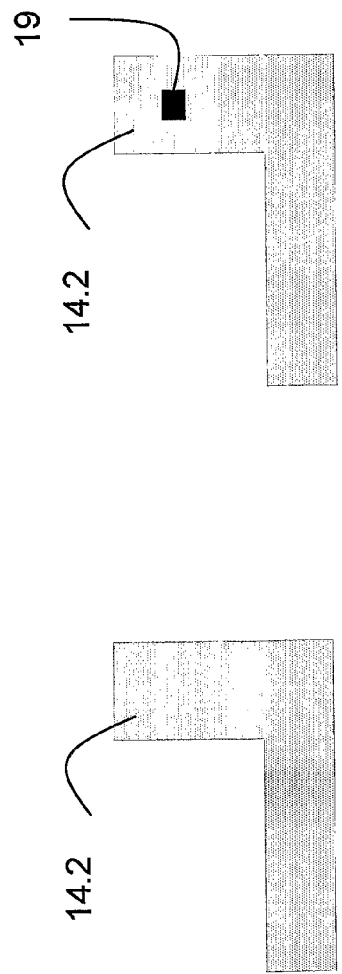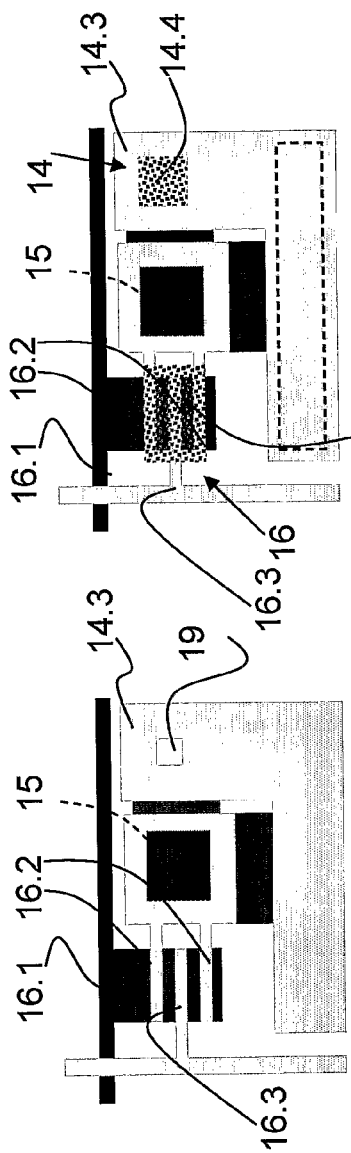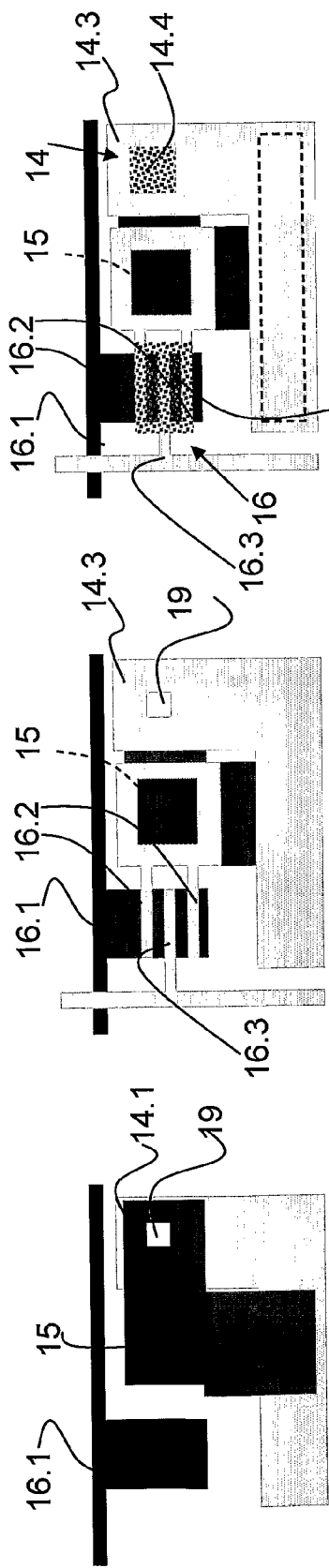
Fig. 5A  Fig. 5B  Fig. 5C  Fig. 5D  Fig. 5E  Fig. 5F

ELECTRONIC DEVICE COMPRISING STATIC INDUCTION TRANSISTOR AND THIN FILM TRANSISTOR, METHOD OF MANUFACTURING AN ELECTRONIC DEVICE AND DISPLAY PANEL

BACKGROUND OF THE INVENTION

1. Field of the invention

The present invention relates to an electronic device.

The present invention further relates to a method of manufacturing an electronic device.

The present invention still further relates to a display panel.

2. Related Art

A field-effect transistor (FET) is a type of transistor that relies on an electric field to control the shape and hence the conductivity of a 'channel' in a semiconductor material. The semiconductor material may be an inorganic material, for example a silicon based semiconductor material, for example in the form of amorphous silicon, microcrystalline silicon, or it can be annealed into polysilicon. Other inorganic semiconductor materials are for example compound semiconductors such as cadmium selenium (CdSe) and metal oxides such as Zinc Oxide. Alternatively organic semiconductors may be applied, for example molecular organics, such as pentacene and TIPS and polymer semiconductors such as thiophene.

A thin film transistor (TFT) is a special kind of field effect transistor made by depositing thin films of a semiconductor active layer as well as the dielectric layer and metallic contacts over a supporting substrate. Thin film transistors are in particular applied for display purposes, due to their low cost and large area processibility. Unfortunately, thin film field-effect transistors show instable behaviour due to their small carrier-injection area and large dielectric-semiconductor interface. Such instabilities lead to shifts in the off-voltage, defined as the gate voltage at which the source-drain current drops below 100 pA, and non-linear contact effects (due to e.g. current crowding at points of injection). Both of these effects influence current stability and reproducibility, which will become critical in backplanes that drive high power front-planes such as organic light emitting devices. This is a known issue in traditional active matrix backplanes and is usually remedied by using several TFTs in parallel per pixel to average the effect of TFT variation, or by compensating these instabilities. Both solutions result in a more complicated design.

A static induction transistor is a vertically structured transistor used in high frequency/high power applications. Static induction transistors are used in high power, high speed and low noise applications, and in applications requiring high degree of linearity. A static induction transistor has an increased injecting area and contrary to the TFT, dielectric-semiconductor interfaces are absent. Therewith a stable behaviour is enabled. As compared to a thin film transistor, a static induction transistor has a low on/off ratio, which is a disadvantage if the transistor has to be used as a switching element.

Summarizing both types of transistors have advantages and disadvantages. In a circuit design some functions may best be performed by a thin film transistor, while other functions may best be performed by a static induction transistor. Accordingly, there is a need to provide an electronic device in which these types of transistors are integrated, as well as a need to provide an efficient way to integrate both types of transistor in such an electronic device.

It is noted that Watanabe et al. describe in "Flexible organic static induction transistors using pentacene thin films", Appl. Phys. Lett. 87, 223505, (2005), a method of manufacturing a static induction transistor which may be used as a driver in a flexible sheet display. The fabrication process described therein is as follows. First, a 100 nm pentacene thin film is deposited on the indium tin oxide (ITO) formed on the flexible PEN substrate. Second, a slit-type Al gate electrode with a thickness of 30 nm is formed on the pentacene film. Third, the Al gate electrode is covered with a second 100 nm pentacene film. Finally, the drain Au electrode is fabricated on the pentacene film. This method requires that twice a patterned semiconductor layer is applied. Furthermore the presence of insulating layers separating source, gate and drain layers is necessary in practice to connect the SIT to other components.

SUMMARY OF THE INVENTION

According to an aspect of the invention an electronic device is provided that comprises at least one static induction transistor and at least one thin film transistor. The static induction transistor has a first channel of a semiconducting material extending between a first main electrode and a second main electrode through a first and a second insulating layer, and has a first control electrode surrounding the first channel and extending between the first and the second insulating layer. The thin film transistor has a third main electrode and a fourth main electrode coupled by a second channel of a semiconducting material and a second control electrode. At least one of the first or the second insulating layer functions as a dielectric layer between the second control electrode and the second channel. The electronic device may comprise of a plurality of thin film transistors and a plurality of static induction transistors as well as other types of transistors and other functional elements such as resistors, capacitors, inductors, diodes etc.

As in the electronic device according to the invention both types of transistor are present, the most suitable thereof can be used for the various functions to be performed by the electronic device. For example if a high on/off ratio is required a TFT may be used, while for functions requiring a high linearity and stability a SIT may be used.

As at least one of the first or the second insulating layer functions as a dielectric layer between the second control electrode and the second channel. The electronic device according to the invention comprising the at least one static induction transistor and the at least one thin film transistor can be manufactured without additional mask steps as compared to an electronic device only comprising thin film transistors. In particular the electronic device can be manufactured efficiently with a method according to a second aspect of the invention comprising the steps of applying a stack of layers, subsequently comprising
a first electrically conductive layer
a first insulating layer
a second electrically conductive layer
a second insulating layer
a third electrically conductive layer
forming a static induction transistor by applying a first body of semiconducting material in a perforation through the first insulating layer, the second electrically conductive layer, the second insulating layer and the second electrically conductive layer, and forming a thin film transistor by applying a second body of semiconducting material at the second electrically conductive layer.

According to a third aspect according to the present invention a display panel is provided comprising a plurality of pixels arranged in a matrix, the pixels comprising an electro-optic element, and an electronic device, wherein the first control electrode of the at least one static induction transistor of the electronic device is coupled to the third main electrode of the at least one thin film transistor, the display panel further comprising a first decoder with outputs coupled to the second control electrodes, and comprising a second decoder with outputs coupled to the fourth main electrodes, and wherein the electro-optic element has a first terminal coupled to the second main electrode of the static induction transistor.

The display panel according to the present invention is particularly advantageous, in that the electro-optic elements of the pixels are driven by a static induction transistor. The static induction transistors drive the pixels with a high linearity and a high stability, therewith obtaining a high display quality. The static induction transistor in its turn is switched by the thin film transistor. Leakage from the control gate is low, so that a charge at the control gate, and therewith a pixel intensity is maintained constant between subsequent refreshments.

It is noted that the present invention is not limited to application in display functions, but is suitable for application in any electronic device requiring a current source, e.g. a driver in a shift register, for memory elements, RF-ID circuits etc, where on the one hand active semiconductor elements having a high on/off ratio and on the other hand active semiconductors element having a high stability and reproducibility are required.

BRIEF DESCRIPTION OF THE DRAWINGS

These and other aspects are described in more detail with reference to the drawing. Therein:

FIG. 1 shows a display,

FIG. 2 shows an electric circuit for a pixel in the display,

FIG. 3 shows a first implementation of a part of the circuit of FIG. 2,

FIG. 4 shows a second implementation of a part of the circuit of FIG. 2, FIG. 5A-5F shows a method of manufacturing the first implementation.

DETAILED DESCRIPTION OF EMBODIMENTS

Figure 7:
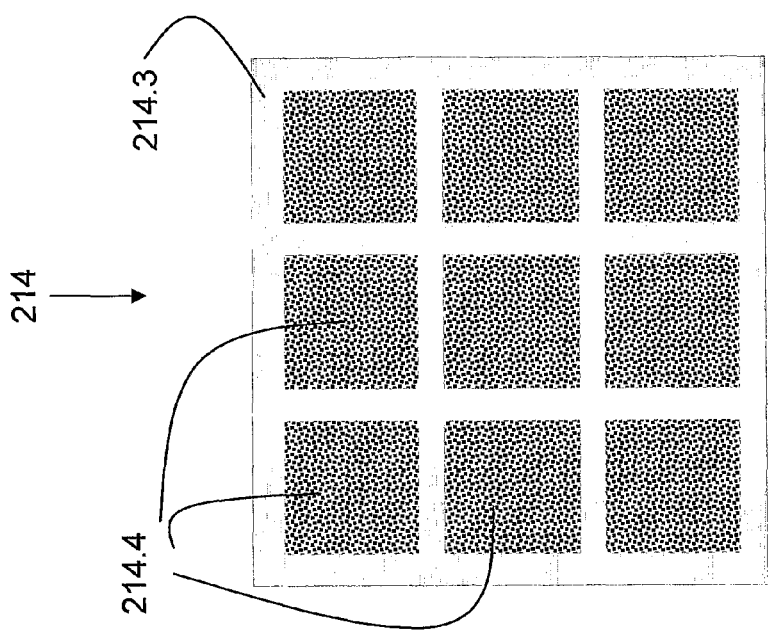
FIG. 7 shows an alternative implementation for a part of the circuit of FIG. 2.

In the following detailed description numerous specific details are set forth in order to provide a thorough understanding of the present invention. However, it will be understood by one skilled in the art that the present invention may be practiced without these specific details. In other instances, well known methods, procedures, and components have not been described in detail so as not to obscure aspects of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

FIG. 1 shows a display panel 1 comprising a plurality of pixels 10 arranged in a matrix of rows and columns.

The display panel further comprises a first and a second decoder 20, 25. The first decoder 20 has outputs 20.1-20.$n$ each for providing a selection signal to a respective row of the matrix. The second decoder 25 has outputs 25.1-25.$m$ each for providing a data signal to a respective column of the matrix.

FIG. 2 shows an electronic circuit including one pixel 10 of the display panel. By way of example the pixel 10 is shown that has a select input coupled to the output 20.1 of the first decoder 20 and a data input coupled to the output 25.1 of the second decoder 25. The other pixels, each coupled to a pair of outputs, one of the decoder and one of the second decoder are similar.

The pixel 10 comprises an electro-optic element 12, here an OLED and an electronic device with at least one static induction transistor 14 and at least one thin film transistor 16.

The static induction transistor 14 has a first control electrode 14.1, and a first channel of a semiconducting material extending between a first main electrode 14.2 and a second main electrode 14.3.

The thin film transistor 16 has a third main electrode 16.2 and a fourth main electrode 16.3 coupled by a second channel of a semiconducting material and a second control electrode 16.1.

The first control electrode 14.1 of the at least one static induction transistor 14 of the electronic device is coupled to the third main electrode 16.2 of the at least one thin film transistor 16. The electro-optic element 12 has a first terminal coupled to the second main electrode 14.3 of the static induction transistor 14. The first control electrode 16.1 of the thin film transistor 16 is coupled to the output 20.1 of the first decoder 20. The second main electrode 16.3 of the thin film transistor 16 is coupled to the output 25.1 of the second decoder 20. The first main electrode 14.2 of the static induction transistor 14 is coupled to the power supply line Vss and the electro-optic element 12 has a further terminal coupled to a reference voltage supply. A capacitive element 18 is provided between the first control electrode 14.1 and the first main electrode 14.2 of the static induction transistor 14.

In the embodiment shown in FIG. 1 the thin-film transistor 16 functions as a selection element for the pixel. The thin film transistor 16 is controlled by the output signal 20.1 of the first decoder 20. If the selection signal at 20.1 is activated the capacitor 18 is charged to the value available at the output line 25.1 from the second decoder 25. If the selection signal provided by output 20.1 is deactivated, the voltage at the charged capacitor 18 determines the value of the drive current provided by the induction transistor 14 to the electro-optic device 12.

FIG. 3 shows a first implementation of the electronic device 5. Parts therein corresponding to those in FIG. 2 have the same reference number.

As shown in FIG. 3, the static induction transistor 14 has a first channel 14.4 of a semiconducting material extending between a its first main electrode 14.2 and its second main electrode 14.3 through a first and a second layer 11, 13 of an insulating material. The first control electrode 14.1 of the static induction transistor 14 surrounds the first channel 14.4 and extends between the first and the second layer of insulating material 11, 13. The third main electrode and a fourth main electrode 16.2 and 16.3 of the thin film transistor 16 are coupled by a second channel 16.4 of a semiconducting material. One of the first or the second layer of insulating material 11, 13, in this case the second layer 13 functions as a dielectric layer between the second control electrode 16.1 and the second channel 16.4 of the thin-film transistor 16.

The first control electrode 14.1 of the at least one static induction transistor 14 is coupled to the third main electrode 16.2 of the at least one thin film transistor 16 by a via 15.

In the embodiment shown the capacitive element 18 is formed by the first main electrode 14.2 and the first control electrode 14.1 of the at least one static induction transistor 14, wherein the first layer of insulating material 11 serves as a dielectric.

Due to the fact that the thin-film transistor 16 has a high on/off ratio, the capacitor 18 is rapidly charged, and once the selection signal at 20.1 is deactivated the voltage at the capacitor 18, and therewith the luminance of the electro-optical element remains substantially constant. As the static induction transistor 14 has a large injection surface area and as a semiconducting-dielectric interface is absent, this transistor 14 provides a current that is well defined by the control voltage. Therewith pixel elements provide a luminance that reproducibly depends on the data value provided by the second decoder 25.

In the embodiment shown, the semiconducting material used for the channels 14.4 and 16.4 of the static induction transistor 14 and the thin film transistor 16 respectively is an organic material. In this case a molecular organic material is used, here pentacene, such as (6,13)-bis Triisopropylsilyl-ethynyl pentacene also known as TIPS-pentacene or a polymer semiconductor material such as thiophene is suitable. The main electrodes 14.2, 14.3, 16.2, 16.3 of the transistors are formed by an electrically conductive material, e.g. a metal such as Au or another material such as ITO (indium tin oxide) having a high work function. The control electrodes are formed by an electrically conductive material having a lower work function within the semiconductor bandgap, e.g. a metal such as Al. The insulating material is for example an organic material, like a polymer or an inorganic material, e.g. a layer of Silicium oxide obtained by a PECVD process. Preferably all materials are applicable by ink-jet printing. The embodiment shown in FIG. 3 has the advantage that a clean interface is present between the semiconducting material 16.4 and the dielectric layer 13, without requiring additional steps.

FIG. 3 also shows by way of example schematically how a display layer 30 comprising electro-optical elements 12, such as LEDs, LCDs, electrophoretic elements can be applied to the electronic device 5. The display layer 30 is provided with respective first contacts 12a coupled to a first terminal of the electro-optical element and with an electrically conductive layer 31 that forms a common contact. The electrically conductive layer 31 is connected to a common voltage supply (GND) and the respective first contacts 12a are electrically coupled to the main electrode 14.3 of the SIT when the layers formed by the electronic device and the display layer 30 are laminated. If desired one or more intermediate layers, having vias for electrically connecting the contacts 12a with the main electrodes 14.3 may be applied between the electronic device 5 and the display layer 30. For example a planarization layer may be applied.

The display layer 30 may be applied as a semi-finished product at the electronic device 5, but alternatively be applied stepwise, e.g. by first applying the individual contacts 12a, then applying the layers that form the electro-optic function 12 using for example evaporation/spincoating/printing and possibly patterning steps, and subsequently applying the electrically conductive layer 31.

FIG. 4 shows a second embodiment of the electronic device according to the invention. Parts therein corresponding to those of FIG. 3 have a reference number that is 100 higher. In the second embodiment the at least one thin film transistor 116 is arranged at a recess 117 in the second layer 111 of insulating material, and the first layer 111 of insulating material functions as the dielectric layer between the second control electrode 116.1 and the second channel 116.4. In practice the layer 111 is thinner than the layer 113, which is in favor of the operation of the TFT.

In the embodiment shown in FIG. 2, the first main electrode 114.2 of the static injection transistor 114 is a drain and the second main electrode 114.3 is a source, and the first channel 114.4 of semiconducting material tapers outward in a direction from the drain 114.2 to the source 114.3. In this way the injection area is improved.

The injection area is further improved, in that the second main electrode 114.3 extends along the first channel 114.4 in a direction towards the first layer 111 of insulating material.

The first control electrode 114.1 extends along the first channel 114.4 in a direction away from the second layer 113 of insulating material.

A method of manufacturing an electronic device as illustrated in FIG. 3 according to the invention is now elucidated with reference to FIGS. 5A-5F. According to this method a first a stack of layers is applied. Contrary to the known manufacturing process a semiconductor material or a precursor thereof in a liquid form is applied after completion of this stack. For clarity, FIGS. 5A-5G show only a part of the product as indicated by the dashed box V in FIG. 6.

The various layers of the device may be applied by conventional methods.

The metal layers may be applied for example by deposition methods, such as sputtering or evaporating, patterning, e.g. by lithography using sacrificial resist layer, shadow mask deposition or lift-off. Likewise, the insulating layers may be applied by: deposition methods such as sputtering, but also by spin-coating, evaporating, dipping, spraying, printing. The insulating layers may be patterned by lithography, shadow mask deposition, lift-off for example.

In a first step, as shown in FIG. 5A a first electrically conductive layer, of a material having a high work function, for example of metal such as Au is applied. This first layer will form the second main terminal 14.2 of the static induction transistor 14.

In a second step a first layer, of an insulating material having a thickness in the range of 100-1000 nm, for example of 400 nm is applied that is provided with a perforation 19 towards the first electrically conductive layer (FIG. 5B). This first layer of insulating material corresponds to layer 11 in FIG. 3. The perforation 19 may have a diameter in the range of 1-100 μm depending, for example proportionally, on the thickness of the layer 11.

In a third step, as shown in FIG. 5C, a second electrically conductive layer, such as Al is applied having a work function within the range formed by the bandgap of the semiconductor material. The second electrically conductive layer has a perforation 19 corresponding to the perforation 19 in the first insulating layer. This second layer forms the first control electrode 14.1 of the static induction transistor 14 and the second control electrode 16.1 of the thin film transistor 16.

In a fourth step, illustrated in FIG. 5D a second insulating layer having a thickness in the range of 100-10000 nm, for example of 400 nm is applied. The layer that corresponds to layer 13 in FIG. 3 is not shown in FIG. 5D. A perforation 19 is formed in the second insulating layer that corresponds with the perforation 19 in the first insulating layer. A further perforation is formed in the second insulating layer. The material used for the third conducting layer forms a via in this perforation and forms a via 15 between the second and a third electrically conductive layer. The via has a diameter in the range of 1-1000 μm, in practice for example about 50 μm.

In a fifth step, as shown in FIG. 5E, this third electrically conductive layer is applied. The third electrically conductive layer forms the second main electrode 14.3 of the static induction transistor 14 and the first and the second main electrode 16.1 and 16.2 of the thin film transistor. A perforation 19 is formed in the second insulating layer that corresponds with the perforation 19 in the first insulating layer.

The patterns in the respective layers may be formed by a patterned deposition thereof, e.g. by printing methods. Alternatively, their patterns may be applied by an etching process or by laser ablation.

In a sixth step, illustrated in FIG. 5F, a static induction transistor 14 having a channel 14.4 is formed by applying a first body of semiconducting material in the perforation through the first insulating layer, the second electrically conductive layer, the second insulating layer and the second electrically conductive layer. A thin film transistor 16 with channel 16.4 is formed by applying a second body of semiconducting material at the second electrically conductive layer. The semiconductor material can be applied using a spin-on semi-conductor, such as a precursor pentacene solution. Alternatively ink-jet processing using Tips-pentacene may be used for the processing of the semiconducting material. A TFT is formed via conventional solution-based processing techniques and is integrated into the pixel circuit. The TFT 16, SIT 14 (and storage capacitor 18) share an insulating dielectric layer 13 which avoids the need for extra processing steps.

Figure 6:
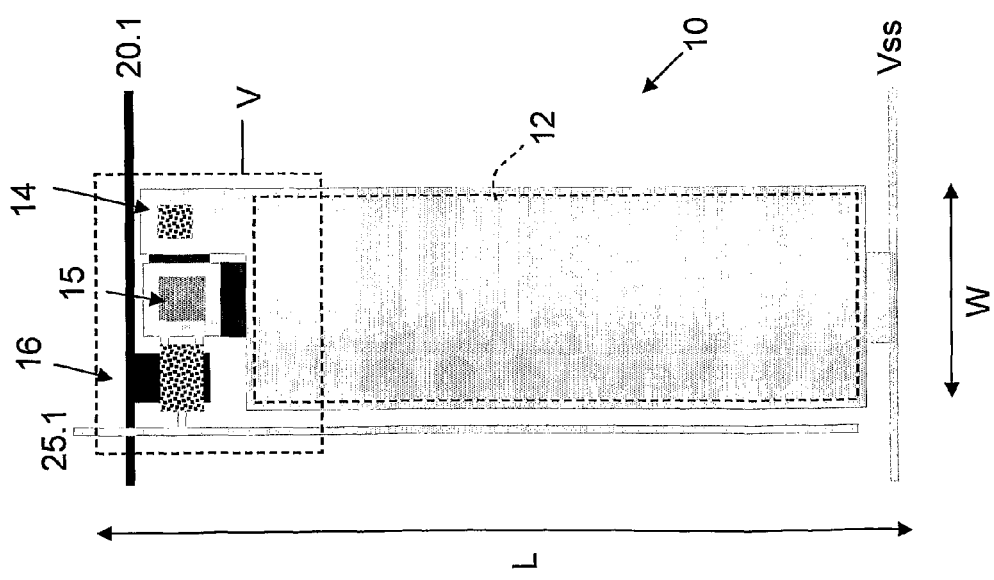
FIG. 6 shows a portion of the product manufactured with the method described with reference to FIGS. 5A-5G corresponding to a single pixel.

FIG. 6 shows a portion of the product manufactured with the method described with reference to FIGS. 5A-5G corresponding to a single pixel 10 (with the location of the optoelectronic element 12 indicated by the dashed box). Also the connection of the terminals of the pixel 10 to the decoder outputs 20.1 and 25.1 is shown. By way of example the pixel 10 has a length L of 200 μm and a width W of 60 μm.

The second embodiment of the electronic device as shown in FIG. 4 may be manufactured by an alternative manufacturing method. According to this alternative method a portion of the second insulating layer where the thin film transistor 114 is to be formed is removed before applying the third electrically conductive layer. This allows IN2 metal to be used as the source 116.3 and drain 116.2 for the TFT 116, while preserving the TFT position in the stack. Furthermore the first electrically conductive layer instead of the second electrically conductive layer is patterned to form a control electrode 114.1 for the thin film transistor 114.

In FIG. 7, parts corresponding to FIG. 6 have a reference number that is 200 higher. FIG. 7 shows an alternative embodiment for forming the static induction transistor 214, wherein the static induction transistor 214 has a plurality of channels 214.4 that share a common source, drain and gate. For clarity only the common source (second main electrode 214.3) and the plurality of channels 214.4 applied therein are shown. However, the second main electrode and the first control electrode may be similarly patterned.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. All publications, patent applications, patents, and other references mentioned herein are incorporated by reference in their entirety. In case of conflict, the present specification, including definitions, will control. In addition, the materials, methods, and examples are illustrative only and not intended to be limiting.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

The invention claimed is:

1. An electronic device comprising:
   at least one static induction transistor; and
   at least one thin film transistor;
   wherein the static induction transistor comprises:
      a first insulating layer;
      a second insulating layer formed over the first insulating layer;
      a first main electrode formed on a bottom surface of the first insulating layer;
      a second main electrode formed on a top surface of the second insulating layer;
      a first semiconducting material comprising a first channel extending through the first and the second insulating layers between the first and the second main electrodes; and
      a first control electrode disposed between the first and the second insulating layers and enclosing the first channel when viewed from a top view;
   wherein the thin film transistor comprises:
      a third main electrode;
      a fourth main electrode;
      a second semiconducting material comprising a second channel coupling the third and the fourth main electrodes; and
      a second control electrode;
   wherein at least one of the first or the second insulating layer functions as a dielectric layer between the second control electrode and the second channel.

2. The electronic device according to claim 1, wherein the first control electrode of the at least one static induction transistor is coupled to the third main electrode of the at least one thin film transistor.

3. The electronic device according to claim 1, wherein the semiconducting material is an organic material.

4. The electronic device according to claim 1, wherein the second control electrode of the at least one thin film transistor is formed between the first and the second insulating layer.

5. The electronic device according to claim 1, wherein the at least one thin film transistor is arranged at a recess in the second insulating layer, and wherein the first insulating layer functions as the dielectric layer between the second control electrode and the second channel.

6. The electronic device according to claim 1, wherein the first main electrode is a drain and the second main electrode is a source, and wherein the first semiconducting material tapers outward in a direction from the drain to the source.

7. The electronic device according to claim 6, wherein the second main electrode extends along the first semiconducting material in a direction towards the first insulating layer.

8. The electronic device according to claim 6, wherein the first control electrode extends along the first semiconducting material in a direction away from the second insulating layer.

9. The electronic device according to claim 1, wherein a capacitive element is formed by the first main electrode and the first control electrode of the at least one static induction transistor.

10. A display panel comprising:
    a plurality of pixels arranged in a matrix, the pixels comprising an electro-optic element;
    an electronic device according to claim 2;
    a first decoder with outputs coupled to the second control electrodes; and
    a second decoder with outputs coupled to the fourth main electrodes, wherein the electro-optic element has a first terminal coupled to the second main electrode of the static induction transistor.

11. The electronic device according to claim 1, wherein the first semiconducting material connects the first main electrode and the second main electrode, and the first semiconducting material directly contacts the first main electrode and the second main electrode.

12. A method of manufacturing an electronic device comprising the steps of:
    applying a stack of layers, subsequently comprising:
       a first electrically conductive layer,
       a first insulating layer disposed over the first electrically conductive layer,
       a second electrically conductive layer disposed over the first insulating layer,
       a second insulating layer disposed over the second electrically conductive layer, and
       a third electrically conductive layer disposed over the second insulating layer;
    forming a static induction transistor by applying a first body of semiconducting material in a perforation through the first insulating layer, the second electrically conductive layer, the second insulating layer and the third electrically conductive layer, wherein the second electrically conductive layer encloses the first body of semiconducting material when viewed from a top view; and
    forming a thin film transistor by applying a second body of semiconducting material at the second electrically conductive layer.

13. The method according to claim 12, wherein a portion of the second insulating layer where the thin film transistor is to be formed is removed before applying the third electrically conductive layer.

* * * * *